US009166184B2

(12) United States Patent
Yang et al.

(10) Patent No.: US 9,166,184 B2
(45) Date of Patent: Oct. 20, 2015

(54) ORGANIC LIGHT EMITTING DEVICE HAVING THREE SUCCESSIVE LIGHT EMITTING SUB-LAYERS WITH MIXTURE MATRIX MATERIAL FOR THE SECOND LIGHT EMITTING SUB-LAYER AND METHOD OF PREPARING SAME AND DISPLAY DEVICE THEREOF

(71) Applicant: BOE TECHNOLOGY GROUP CO., LTD., Beijing (CN)

(72) Inventors: Dongfang Yang, Beijing (CN); Tian Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/993,187

(22) PCT Filed: Oct. 31, 2012

(86) PCT No.: PCT/CN2012/083893
§ 371 (c)(1),
(2) Date: Jun. 11, 2013

(87) PCT Pub. No.: WO2013/181897
PCT Pub. Date: Dec. 12, 2013

(65) Prior Publication Data
US 2014/0054570 A1  Feb. 27, 2014

(30) Foreign Application Priority Data
Jun. 4, 2012 (CN) .......................... 2012 1 0181500

(51) Int. Cl.
*H01L 29/08* (2006.01)
*H01L 21/00* (2006.01)
(Continued)

(52) U.S. Cl.
CPC ............ *H01L 51/5004* (2013.01); *H01L 51/56* (2013.01); *H01L 2251/5384* (2013.01); *H01L 2251/552* (2013.01)

(58) Field of Classification Search
CPC ..... H01L 51/50; H01L 51/52; H01L 51/5004; H01L 2251/5384; H01L 2251/552; H01L 51/56; H01L 51/504; H01L 51/006; H01L 51/5036
USPC ......... 257/40, E51.026, E21.499; 438/45, 29, 438/22
See application file for complete search history.

(56) References Cited

U.S. PATENT DOCUMENTS 6,303,238 B1 * 10/2001 Thompson et al. ........... 428/690
2006/0134461 A1 * 6/2006 Huo et al. ..................... 428/690
(Continued)

FOREIGN PATENT DOCUMENTS

CN        101414665 A        4/2009
CN        101952990 A        1/2011
(Continued)

OTHER PUBLICATIONS

First Chinese Office Action dated Aug. 28, 2013; Appln. No. 201210181500.0.
(Continued)

*Primary Examiner* — Long K Tran
*Assistant Examiner* — Dzung Tran
(74) *Attorney, Agent, or Firm* — Ladas & Parry LLP

(57) ABSTRACT

Disclosed is an organic light-emitting device comprising a substrate (1), an anode layer (2), a cathode layer (10) and an organic functional layer comprising a light-emitting layer (6); the light-emitting layer (6) comprises three successive light-emitting sub-layers, i.e., a first light-emitting sub-layer (61) close to the anode layer, a second light-emitting sub-layer (62), and a third light-emitting sub-layer (63) close to the cathode layer. This organic light-emitting device can effectively improve the carrier utilization ratio and thereby improving the light-emitting efficiency of the organic light-emitting device.

14 Claims, 4 Drawing Sheets

(51) Int. Cl.
*H01L 51/50* (2006.01)
*H01L 51/56* (2006.01)

(56) References Cited

U.S. PATENT DOCUMENTS

| | | |
|---|---|---|
| 2007/0116983 A1* | 5/2007 | Kanno et al. .................. 428/690 |
| 2007/0134514 A1* | 6/2007 | Kondakov et al. ............ 428/690 |
| 2008/0113216 A1* | 5/2008 | Inoue et al. ................... 428/690 |
| 2009/0226757 A1 | 9/2009 | Song et al. |
| 2011/0057178 A1 | 3/2011 | Shitagaki et al. |
| 2011/0101328 A1 | 5/2011 | Kaiser et al. |
| 2011/0215301 A1 | 9/2011 | Forrest |
| 2011/0240984 A1 | 10/2011 | Adamovich et al. |
| 2012/0032153 A1 | 2/2012 | Jou et al. |
| 2014/0054570 A1 | 2/2014 | Yang et al. |

FOREIGN PATENT DOCUMENTS

| | | |
|---|---|---|
| CN | 102076815 A | 5/2011 |
| CN | 102292839 A | 12/2011 |
| CN | 102484923 A | 5/2012 |
| CN | 102694131 A | 9/2012 |
| TW | 201208474 A | 2/2012 |

OTHER PUBLICATIONS

International Search Report mailed Jul. 3, 2013; PCT/CN2012/083893.
Rejection Decision Issued May 5, 2014 Appln. No. 201210181500.0.
International Preliminary Report on Patentability dated Dec. 9, 2014; PCT/CN2012/083893.
Second Chinese Office Action Appln. No. 201210181500.0; Dated Jan. 30, 2015.

* cited by examiner

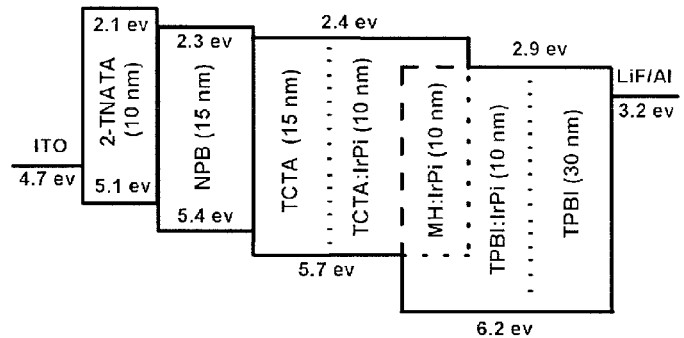

FIG.7

1) preparing a first light-emitting sub-layer which is formed by doping a matrix material with hole transport capacity with a light-emitting material 2) preparing a second light-emitting sub-layer on the first light-emitting sub-layer, wherein the second light-emitting sub-layer is formed by mixing a matrix material with hole transport capacity and a matrix material with electron transport capacity and doping with a light-emitting material 3) preparing a third light-emitting sub-layer on the second light-emitting sub-layer, wherein the third light-emitting sub-layer is formed by doping a matrix material with electron transport capacity with a light-emitting material

FIG.8

ORGANIC LIGHT EMITTING DEVICE HAVING THREE SUCCESSIVE LIGHT EMITTING SUB-LAYERS WITH MIXTURE MATRIX MATERIAL FOR THE SECOND LIGHT EMITTING SUB-LAYER AND METHOD OF PREPARING SAME AND DISPLAY DEVICE THEREOF

TECHNICAL FIELD

The invention relates to an organic light-emitting device and a method of preparing the same, as well as a display device thereof.

BACKGROUND

OLED (Organic Light-Emitting Device) is a kind of light-emitting device using an organic solid semiconductor as a light-emitting material. Since it has the advantages such as simple process of preparation, low costs, low energy consumption, high luminosity, broad working temperature, etc., it has broad perspective of application.

As shown in FIG. 1, the structure of an existing OLED usually comprises a substrate 1, an anode layer 2, a cathode layer 10, and an organic functional layer disposed between the anode layer 2 and the cathode layer 10, the organic functional layer comprising, in sequence, a hole injection layer 3, a hole transport layer 4, an electron blocking layer 5, a light-emitting layer 6, a hole and exciton blocking layer 7, an electron transport layer 8, and an electron injection layer 9. The hole injection layer 3 is adjacent to the anode layer 2, and the electron injection layer 9 is adjacent to the cathode layer 10.

The light-emitting mechanism of an OLED is as follows: when a voltage is applied across the anode layer 2 and the cathode layer 10, driven by the external voltage, the holes injected from the anode layer 2 enter the light-emitting layer 6 through the hole injection layer 3 and the hole transport layer 4, the electrons injected from the cathode layer 10 enter the light-emitting layer 6 through the electron injection layer 9 and the electron transport layer 8; the holes and the electrons entering the light emitting layer 6 recombine with each other in the recombination region to form excitons, which undergo radiative transition to emit light, that is, resulting in electroluminescence.

Since the holes and the electrons have different mobility, the recombination region usually is located within the light-emitting layer and close to the interface with the electron transport layer. After the formation, the excitons diffuse towards both sides of this interface. Some excitons may diffuse to regions undoped with a light-emitting material and decay there, thereby resulting in non-radiative transition.

To sufficiently utilize the energy released from the recombination of the electron and hole carriers, improve the carrier utilization ratio in an OLED, and thus to improve the efficiency of light-emitting of the OLED is an issue in urgent need to be solved in the organic electroluminescence field.

SUMMARY

The technical problems to be solved in the present invention involves providing of an organic light-emitting device and a method of preparing the same as well as a display device thereof with respect to the aforementioned deficiencies in prior art, the organic light-emitting device can effectively improve the carrier utilization ratio and thus improve the efficiency of light-emitting of the organic light-emitting device.

One aspect of the invention provides an organic light-emitting device comprising a substrate, an anode layer, a cathode layer and an organic functional layer disposed between the anode layer and the cathode layer; the organic functional layer comprises a light-emitting layer, and the light-emitting layer comprises three successive light-emitting sub-layers, including a first light-emitting sub-layer close to the anode layer, a second light-emitting sub-layer, and a third light-emitting sub-layer close to the cathode layer.

For the organic light-emitting device, for example, each of the three light-emitting sub-layers is formed by doping a matrix material with a light-emitting material; a mixture matrix material is employed as the matrix material for the second light-emitting sub-layer, and the mixture matrix material is formed by mixing a matrix material with hole transport capacity and a matrix material with electron transport capacity; a matrix material with hole transport capacity is employed as the matrix material for the first light-emitting sub-layer; and a matrix material with electron transport capacity is employed as the matrix material for the third light-emitting sub-layer.

For the organic light-emitting device, for example, the position of HOMO of the matrix material for the first light-emitting sub-layer is 0.2 ev or more higher than the position of HOMO of the matrix material for the third light-emitting sub-layer, and the position of LUMO of the matrix material for the first light-emitting sub-layer is 0.2 ev or more higher than the position of LUMO of the matrix material for the third light-emitting sub-layer.

For the organic light-emitting device, for example, in the mixture matrix material for the second light-emitting sub-layer, the matrix material with hole transport capacity is formed from a matrix material identical to the matrix material for the first light-emitting sub-layer, and the matrix material with electron transport capacity is formed from a matrix material identical to the matrix material for the third light-emitting sub-layer.

For the organic light-emitting device, for example, in the mixture matrix material for the second light-emitting sub-layer, the mixing ratio of the matrix material with hole transport capacity to the matrix material with electron transport capacity is in the range of 1:9~9:1.

For the organic light-emitting device, for example, aromatic diamine compounds, triphenylamine compounds, aromatic triamine compounds, benzidine derivatives or triarylamine polymers are employed as the matrix material for the first light-emitting sub-layer and the matrix material with hole transport capacity in the second light-emitting sub-layer; metal complexes, carbazole derivatives, imidazole derivatives, phenanthroline derivatives or anthracene derivatives are employed as the matrix material for the third light-emitting sub-layer and the matrix material with electron transport capacity in the second light-emitting sub-layer; and a phosphorescent material based on Tr, Pt, Ru or Cu is employed as the light-emitting material in the first, second and third light-emitting sub-layers.

For the organic light-emitting device, for example, 9,10-bis(2-naphthyl)anthracene, TAZ, CBP, MCP, 4,4',4''-tris(carbazol-9-yl)triphenylamine (TCTA) or N,N'-diphenyl-N,N'-bis(1-naphthyl)-1 (NPB) is employed as the matrix material for the first light-emitting sub-layer and the matrix material with hole transport capacity in the second light-emitting sub-layer; 8-hydroxyquinoline aluminum (Alq3), 8-hydroxyquinoline lithium (Liq), 1,3,5-tris(N-phenyl-2-benzimidazole-2)benzene (TPBI), BCP or Bphen is employed as the matrix material for the third light-emitting sub-layer and the matrix material with electron transport capacity in the second light-emitting sub-layer.

For the organic light-emitting device, for example, a thickness of the light-emitting layer is in the range of 3~300 nm; a thickness of the first, second and third light-emitting sub-layers is in the range of 1~100 nm.

For the organic light-emitting device, for example, the organic functional layer further comprises a hole transport layer and an electron transport layer, the hole transport layer is adjacent to the first light-emitting sub-layer and on a side close to the anode, and the electron transport layer is adjacent to the third light-emitting sub-layer and on a side close to the cathode; the energy level of the hole transport layer matches the energy level of the matrix material for the first light-emitting sub-layer, and the energy level of the electron transport layer matches the energy level of the matrix material for the third light-emitting sub-layer.

For the organic light-emitting device, for example, the position of HOMO of the hole transport layer is different from the position of HOMO of the matrix material for the first light-emitting sub-layer by no more than 0.5 ev, and the position of LUMO of the electron transport layer is different from the position of LUMO of the matrix material for the third light-emitting sub-layer by no more than 0.5 ev.

For the organic light-emitting device, for example, the hole transport layer comprises two or more hole transport sub-layer, which at least comprises a first hole transport layer and a second hole transport layer, and the second hole transport layer is adjacent to the first light-emitting sub-layer, the position of HOMO of the second hole transport layer is different from the position of HOMO of the matrix material for the first light-emitting sub-layer by no more than 0.2 ev, and the position of LUMO of the electron transport layer is different from the position of LUMO of the matrix material for the third light-emitting sub-layer by no more than 0.2 ev.

Another aspect of the present invention provides a display device comprising the aforementioned light-emitting device.

Yet another aspect of the invention provides a method of preparing an organic light-emitting device comprising a step of preparing a light-emitting layer, which comprises:

1) preparing a first light-emitting sub-layer which is formed by doping a matrix material with hole transport capacity with a light-emitting material;

2) preparing a second light-emitting sub-layer on the first light-emitting sub-layer, wherein the second light-emitting sub-layer is formed by mixing a matrix material with hole transport capacity and a matrix material with electron transport capacity and doping with a light-emitting material; and 3) preparing a third light-emitting sub-layer on the second light-emitting sub-layer, wherein the third light-emitting sub-layer is formed by doping a matrix material with electron transport capacity with a light-emitting material.

BRIEF DESCRIPTION OF THE DRAWINGS

In order to more clearly illustrate the technical solutions of the embodiments of the present invention, figures of the embodiments will be briefly introduced below. Apparently, the figures in the following description merely relate to some embodiments of the present invention and are not limiting the present invention.

FIG. 7 is a schematic diagram of the energy level structure of Embodiment 3; and FIG. 8 is the flow chart for the method of preparing the organic light-emitting device of the present invention.

DESCRIPTION OF THE REFERENCE NUMBERS

1-substrate; 2-anode layer; 3-hole injection layer, 4-hole transport layer; 5-electron blocking layer; 6-light emitting layer, 7-hole and exciton blocking layer, 8-electron transport layer, 9-electron injection layer, 10-cathode layer; 11-external power supply; 41-first hole transport layer, 42-second hole transport layer; 61-first light-emitting sub-layer, 62-second light-emitting sub-layer; 63-third light-emitting sub-layer

DETAILED DESCRIPTION

In order to make the object, technical solutions and advantages of the embodiments of the invention more clear, the technical solutions of the embodiments of the present invention are clearly and completely described below in relation to the figures of the embodiments of the present invention. Apparently, the embodiments described are merely some, rather than all embodiments of the present invention. Based on the embodiments of the invention described, any other embodiments obtained by a person of ordinary skill in the art without resorting to creative labor are within the scope of the present invention.

Unless otherwise defined, the technical or scientific terms used herein shall have the usual meaning understood by a person of ordinary skill in the art of the present invention. Wordings "first", "second" and the like used in the description and claims of the present invention by no means indicate any order, quantity or significance, but are merely used to distinguishing different components. Also, "a", "an", "the" or the like does not indicate limitation of quantity, either, but rather indicate the existence of at least one. Terms such as "link", "connect" or the like is not limited to physical or mechanical connection, but can encompass electric connection, no matter direct or indirect.

Generally, the point of zero energy is defined as vacuum or a point of infinite distance, and all carriers are in negative energy levels. In embodiments of the present invention, the values of energy levels are absolute values, that is, the value of the energy level is described with the absolute value. For example, the energy level at vacuum or a point of infinite distance is zero, an energy level of a low work function value indicates an energy level with a low absolute value of energy level (energy level value), and an energy level of a high work function value indicates a energy level with a high absolute value of energy level (energy level value). When compared in an energy level diagram, what are compared are the higher or lower positions of the energy levels. For example, the position of an energy level of a low work function value is higher than an energy level of a high work function value, or in other words, the position of the energy level of 5ev is lower than the position of the energy level of 3 ev.

Embodiment 1

Figure 1:
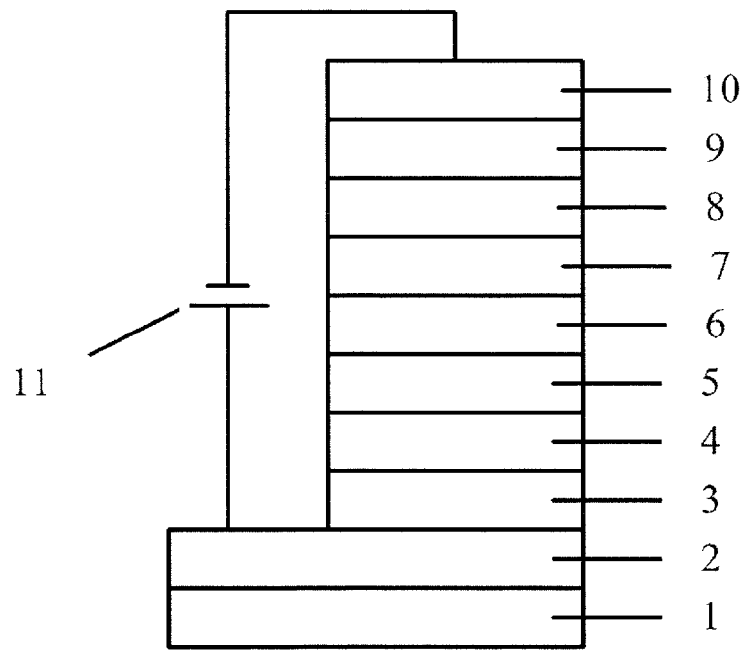
FIG. 1 is a schematic diagram of the structure of the organic light-emitting device in prior art.
Figure 2:
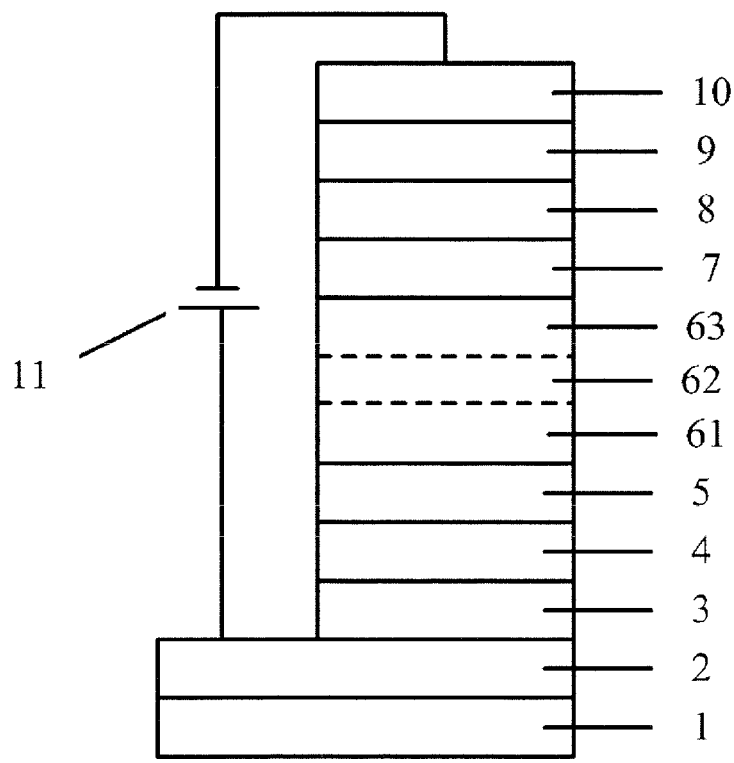
FIG. 2 is a schematic diagram of the structure of the organic light-emitting device in Embodiment 1.

As shown in FIG. 2, in the present embodiment, the organic light-emitting device comprises a substrate 1, an anode layer 2, a cathode layer 10, and an organic functional layer disposed between the anode layer 2 and the cathode layer 10. In the present embodiment, the organic functional layer comprises a hole injection layer 3, a hole transport layer 4, an electron blocking layer 5, a light-emitting layer 6, a hole and exciton blocking layer 7, an electron transport layer 8, and an electron injection layer 9. The external power supply 11 is connected between the anode layer 2 and the cathode layer 10. The organic light-emitting device emits light under the drive by the external power supply 11.

Of course, the electron blocking layer 5 and/or the hole and exciton blocking layer 7 may not be comprised in the aforementioned organic functional layer. That is, alternatively, the organic light-emitting device of the present embodiment comprises the substrate 1, the anode layer 2, the cathode layer 10, and the organic functional layer disposed between the anode layer 2 and the cathode layer 10, wherein the organic functional layer may only comprise the hole transport layer 4, the light-emitting layer 6, and the electron transport layer 8. Alternatively, the organic light-emitting device of the present embodiment comprises the substrate 1, the anode layer 2, the cathode layer 10, and the organic functional layer disposed between the anode layer 2 and the cathode layer 10, wherein the organic functional layer may only comprise the light-emitting layer 6.

In the present embodiment, the light-emitting layer 6 comprises three successive light-emitting sub-layers, i.e., a first light-emitting sub-layer 61 close to the anode layer 2, a third light-emitting sub-layer 63 close to the cathode layer 10, and a second light-emitting sub-layer 62 disposed between the first light-emitting sub-layer 61 and the third light-emitting sub-layer 63.

All the three light-emitting sub-layers are each prepared by doping a matrix material with a light-emitting material. Among them, a mixture matrix material is employed as the matrix material for the second light-emitting sub-layer 62, which mixture matrix material is formed by mixing a matrix material with hole transport capacity and a matrix material with electron transport capacity; a single matrix material with hole transport capacity is employed as the matrix material for the first light-emitting sub-layer 61, and a single matrix material with electron transport capacity is employed as the matrix material for the third light-emitting sub-layer 63.

Here, a matrix material with hole transport capacity means the matrix material with hole transport capacity higher than electron transport capacity, and a matrix material with electron transport capacity means the matrix material with electron transport capacity higher than hole transport capacity. In other words, hole transport capacity can be defined as the charge transport capacity with hole mobility higher than electron mobility, and can be measured according to conventional methods such as a time-of-flight method; the meaning for a matrix material with electron transport capacity or with hole transport capacity can be obtained similarly.

The position of HOMO (Highest Occupied Molecular Orbital) of the matrix material for the first light-emitting sub-layer 61 is 0.2 ev or more higher than the position of HOMO of the matrix material for the third light-emitting sub-layer 63, and the position of LUMO (Lowest Unoccupied Molecular Orbital) of the matrix material for the first light-emitting sub-layer 61 is 0.2 ev or more higher than the position of LUMO of the matrix material for the third light-emitting sub-layer 63.

Aromatic diamine compounds, triphenylamine compounds, aromatic triamine compounds, benzidine derivatives or triarylamine polymers can be employed as the matrix material of the first light-emitting sub-layer 61. In the present embodiment, 9,10-bis(2-naphthyl)anthracene (ADN), TAZ, CBP, MCP, 4,4',4"-tris(carbazol-9-yl)triphenyl amine (TCTA) or N,N'-diphenyl-N,N'-bis(1-naphthyl)-1 (NPB) may be employed as the matrix material of the first light-emitting sub-layer 61.

Metal complexes, carbazole derivatives, imidazole derivatives, phenanthroline derivatives or anthracene derivatives can be employed as the matrix material of the third light-emitting sub-layer 63. In the present embodiment, 8-hydroxyquinoline aluminum (Alq3), 8-hydroxyquinoline lithium (Liq), 1,3,5-tris(N-phenyl-2-benzimidazole-2)benzene (TPBI), BCP or Bphen may be employed as the matrix material of the third light-emitting sub-layer 63.

In the present embodiment, in the mixture matrix material for the second light-emitting sub-layer 62, a matrix material identical to the matrix material for the first light-emitting sub-layer 61 is employed as the matrix material with hole transport capacity, and a matrix material identical to the matrix material for the third light-emitting sub-layer 63 is employed as the matrix material with electron transport capacity. The mixing ratio of the matrix material with hole transport capacity to the matrix material with electron transport capacity may be in the range of 1:9~9:1. In the present embodiment, this ratio is 1:1.

Phosphorescent materials based on Ir, Pt, Ru and Cu can be employed as the light-emitting material in the first light-emitting sub-layer 61, the second light-emitting sub-layer 62 and the third light-emitting sub-layer 63. In the present embodiment, Flrpic, Fir6, FirN4, Flrtaz, Ir(ppy)3, IrPi, Ir(ppy)2(acac), PtOEP, (btp)2Iracac, Ir(piq)2(acac), (MDQ)2Iracac and the like can be used as the phosphorescent materials.

The thickness of the light-emitting layer can be in the range of 3~300 nm. The thickness of each of the first light-emitting sub-layer 61, the second light-emitting sub-layer 62 and the third light-emitting sub-layer 63 may be in the range of 1~100 nm. In the present embodiment, the thicknesses of the first light-emitting sub-layer 61, the second light-emitting sub-layer 62 and the third light-emitting sub-layer 63 can all be 10 nm.

The energy level of the hole transport layer 4 matches the energy level of the matrix material for the first light-emitting sub-layer 61, that is, the position of HOMO of the hole transport layer 4 is close to the position of HOMO of the matrix material for the first light-emitting sub-layer 61; the position of HOMO of the hole transport layer 4 is higher than the position of HOMO of the matrix material for the first light-emitting sub-layer 61 by 0.5 ev or less, so that holes can readily enter the first light-emitting sub-layer 61; the energy level of the electron transport layer 8 matches the energy level of the matrix material for the third light-emitting sub-layer 63, that is, the position of LUMO of the electron transport layer 8 is close to the position of LUMO of the matrix material for the third light-emitting sub-layer 63; the position of LUMO of the electron transport layer 8 is lower than the position of LUMO of the matrix material for the third light-emitting sub-layer 63 by 0.5 ev or less, so that electrons can readily enter the third light-emitting sub-layer 63. In the meantime, the aforementioned matching relations between energy levels reduce the injection potential barrier of hole carriers and electron carriers, favor the improvement of the efficiency of the injection of electron carriers and hole carriers into the light-emitting layer, and thus improve the light-emitting efficiency of the organic light-emitting device.

Preferably, when the hole transport layer comprises two or more hole transport sub-layers, the position of HOMO of the hole transport layer adjacent to the light-emitting layer is different from the position of HOMO of the matrix material for the first light-emitting sub-layer 61 by no more than 0.2 ev (the former is higher than the latter); or when the electron transport layer comprises two or more electron transport sub-layers, the position of LUMO of the electron transport layer 8 adjacent to the light-emitting layer is different from the position of LUMO of the matrix material for the third light-emitting sub-layer 63 by no more than 0.2 ev (the former is lower than the latter). That is, the position of HOMO of the hole transport layer adjacent to the light-emitting layer is higher than the position of HOMO of the matrix material for the first light-emitting sub-layer 61 by 0.2 ev or less, and the position of LUMO of the electron transport layer 8 adjacent to the light-emitting layer is lower than the position of LUMO of the matrix material for the third light-emitting sub-layer 63 by 0.2 ev or less.

It is further preferred that the hole transport layer 4 or the hole transport layer adjacent to the light-emitting layer is made from the same material as the matrix material for the first light-emitting sub-layer 61, and the electron transport layer 8 or the electron transport layer adjacent to the light-emitting layer is made from the same material as the matrix material for the third light-emitting sub-layer 63.

In the present embodiment, the hole and exciton blocking layer 7 can be made from the same material as that for the electron transport layer 8, and the position of HOMO of the material is lower than the position of HOMO of the matrix material with hole transport capacity in the light-emitting layer. Phenanthroline derivatives, oxazole derivatives, thiazole derivatives, imidazole derivatives, metal complexes and anthracene derivatives can be employed for the hole and exciton blocking layer 7 and the electron transport layer 8. Specifically, 8-hydroxyquinoline aluminum (Alq3). 8-hydroxyquinoline lithium (Liq), 8-hydroxyquinoline gallium, bis[2-(2-hydroxyphenyl-1)-pyridine]beryllium, 2-(4-diphenyl)-5-(4-t-butylphenyl)-1,3,4-oxadiazole (PDB), 1,3,5-tris(N-phenyl-2-benzimidazole-2)benzene (TPBI), BCP, Bphen or the like can be employed.

In certain circumstances, the hole and exciton blocking layer 7 and the electron transport layer can be disposed in a same layer. This layer simultaneously have the functions of hole blocking, exciton blocking and electron transport.

In the present embodiment, aromatic diamine compounds, triphenylamine compounds, aromatic triamine compounds, benzidine derivatives, triarylamine polymers and carbazole polymers can be employed for the hole transport layer 4. For example, NPB, TPD, TCTA, as well as polyvinylcarbazole and monomer thereof.

The range of selection for the electron blocking layer 5 can be identical to the range of selection for the hole transport layer 4.

The hole injection layer 3 can be made from triphenylamine compounds or P type doped organic layers or polymers, such as tris[4-(5-phenyl-2-thienyl)phenyl]amine, 4,4',4"-tris[2-naphthyl(phenyl)amino]triphenylamine (2-TNATA) or 4,4',4"-tris[2-methylphenylanilino]triphenylamine (m-MTDATA), copper phthalocyanine (CuPc), Pedot: Pss, TPD or F4TCNQ.

In addition, the substrate 1, used as the base of the electrode layers and organic functional layers, has good transmitting property in visible light zone, certain resistance against moisture and oxygen permeation, and good surface smoothness. It can be a glass or flexible substrate or a TFT panel; the flexible substrate can be made from one of the materials of polyester and polyimide compounds, or can be made from a thin metal sheet.

The anode layer 2, as the connection layer for the positive voltage of the organic light-emitting device, has good conductivity, transmittance of visible light and a high work function value. The anode layer 2 is usually made from an inorganic metal oxide (such as indium tin oxide (ITO), zinc oxide (ZnO)), organic conductive polymer (such as PEDOT:PSS, PANI, etc.), or a metal material of high work function value (such as gold, copper, silver, platinum, etc.).

The cathode layer 10, as the connection layer for the negative voltage of the organic light-emitting device, has good conductivity and a low work function value. The cathode layer 10 is usually made from a metal material of low work function value such as lithium, magnesium, calcium, strontium, aluminum, indium, or the like or any alloy of the aforementioned metal materials of low work function value with copper, gold or silver.

In the present embodiment, inside the light-emitting layer, the mixture matrix material in the second light-emitting sub-layer 62 comprises 50% of the matrix material with electron transport capacity, so the position of HOMO of this mixture matrix material is lower than the position of HOMO of the matrix material for the first light-emitting sub-layer 61, thus some hole carriers can accumulate at the interface between the first light-emitting sub-layer 61 and the second light-emitting sub-layer 62; in the meantime, the position of LUMO of this the matrix material for the first light-emitting sub-layer 61 is higher than the position of LUMO of the mixture matrix material for the second light-emitting sub-layer 62, thus some electron carriers can also accumulate at the aforementioned interface. Therefore, a carrier recombination region can form at the interface between the first light-emitting sub-layer 61 and the second light-emitting sub-layer 62; similarly a carrier recombination region can form at the interface between the second light-emitting sub-layer 62 and the third light-emitting sub-layer 63. In the meantime, in the second light-emitting sub-layer 62, a mixture of two matrix materials with different carrier transport capacity, e.g., 50% of a matrix material with hole transport capacity and 50% of an electron material with hole transport capacity, is employed as the matrix material, these two kinds of carriers can be transported simultaneously in the second light-emitting sub-layer 62, and the recombination region for the carriers are wide. Consequently, a wide carrier recombination region is formed in the light-emitting sub-layer 62, which on one hand reduces the accumulation concentration of carriers and excitons, and on the other hand expands the range in which the carriers can be recombined, thereby improving the efficiency of the organic light-emitting device and reducing the efficiency loss under a high current density.

In the present embodiment, as shown in FIG. 8, the method of preparing the organic light-emitting device comprises the following steps.

S1) Cleaning the Substrate

In the present embodiment, the substrate 1 is washed successively in a cleaning agent, ethanol solution, acetone solution and deionized water, and then dried with dry nitrogen gas.

S2) Preparing the Anode or Cathode Layer

The substrate 1 is placed in a vacuum evaporating chamber for the preparation of the anode layer 2 or the cathode layer 10 or for other treatment.

In the present embodiment, that is, the substrate 1 is transferred into a vacuum evaporating chamber. An indium tin oxide (ITO) film is formed on the substrate 1, thereby forming the anode layer 2 of the organic light-emitting device on the substrate 1. Moreover, the ITO film has square resistance of 25 Ω/□.

Of course, in an actual manufacturing process, in order to improve the efficiency of production, the step S1 and step S2 can be finished in advance to form corresponding substrates with the anode layer or the cathode layer, so that the substrates can be directly utilized in subsequent processing.

S3) Pre-Treating the Formed Anode Layer or Cathode Layer

In the present embodiment, the substrate 1 with the prepared anode layer 2 is transferred to a vacuum chamber. The anode layer 2 is pretreated using oxygen plasma or argon plasma so as to improve the cleanliness and surface smoothness of the ITO film, improve the surface property of the ITO film and increase its work function value.

S4) Preparing the Organic Functional Layers

Specifically, the organic functional layers are prepared on the treated anode layer 2 or cathode layer 10; the light-emitting layer comprises three light-emitting sub-layers.

In the present embodiment, the treated substrate 1 is transferred into a vacuum chamber and then the preparation of organic functional layers is conducted. In accordance with the structure of the organic light-emitting device in the present embodiment, the order of evaporation deposition is as follows: a hole injection layer 3, a hole transport layer 4, an electron blocking layer 5, a light-emitting layer 6, a hole and exciton blocking layer 7, an electron transport layer 8, and an electron injection layer 9. Among them, the light-emitting layer 6 comprises, from the bottom to the top, the first light emitting sub-layer 61, the second light emitting sub-layer 62 and the third light emitting sub-layer 63. The process for preparing the light-emitting layer 6 comprises the following steps:

1) preparing a first light emitting sub-layer 61, which is formed by doping a matrix material with hole transport capacity with a light-emitting material;

2) preparing a second light-emitting sub-layer 62 on the first light-emitting sub-layer 61, the second light-emitting sub-layer being prepared by mixing a matrix material with hole transport capacity and a matrix material with electron transport capacity and then doping the mixture with a light-emitting material; and 3) preparing the third light-emitting sub-layer 63 on the second light-emitting sub-layer, wherein the third light-emitting sub-layer is formed by doping a matrix material with electron transport capacity with a light-emitting material.

S5) preparing an Anode Layer or a Cathode Layer

In the present embodiment, after the completion of preparation of the organic functional layer, the substrate 1 is placed under a high vacuum condition for the preparation of the cathode layer 10.

The evaporation deposition rate and the thickness of the various layers of the organic function layer in the organic light-emitting device, which are involved in the aforementioned step S2~S5, are monitored by a film thickness meter disposed close to the substrate.

S6) Encapsulating

The prepared organic light-emitting device is transferred to a manual operating box for encapsulating. The manual operating box is in an inert atmosphere, and in the present embodiment, nitrogen atmosphere.

S7) Testing

The prepared organic light-emitting device is tested with respect to its photoelectric performance.

There is provided a display device comprising the aforementioned light-emitting device.

Embodiment 2

Figure 3:
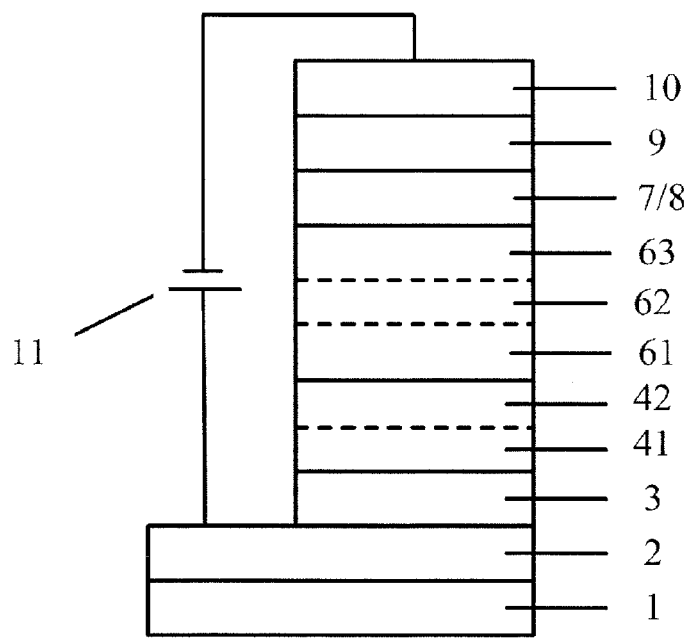
FIG. 3 is a schematic diagram of the structure of the organic light-emitting devices in Embodiments 2 and 3.

As shown in FIG. 3, the organic light-emitting device of the present embodiment comprises a substrate 1, an anode layer 2, a cathode layer 10, and an organic functional layer disposed between the anode layer 2 and the cathode layer 10. The organic functional layer comprises a light-emitting layer 6, which comprises the same structure as the light-emitting layer 6 in Embodiment 1, that is, the light-emitting layer 6 comprises three light-emitting sub-layers (combination regions). i.e., a first light-emitting sub-layer 61, a second light-emitting sub-layer 62, and a third light-emitting sub-layer 63.

Furthermore, a mixture matrix material is employed as the matrix material for the second light-emitting sub-layer 62, and this mixture matrix material is formed by mixing a matrix material with hole transport capacity and a matrix material with electron transport capacity; a matrix material with hole transport capacity is employed as the matrix material for the first light-emitting sub-layer 61; and a matrix material with electron transport capacity is employed as the matrix material for the third light-emitting sub-layer 63.

In the organic light-emitting device of the present embodiment, the hole transport layer 4 comprises two hole transport sub-layers, that is, the hole transport layer comprises a first hole transport layer 41 and a second hole transport layer 42, and second hole transport layer 42 is adjacent to the light-emitting layer 6. For example, the first hole transport layer 41 is adjacent to the hole injection layer 3, and the second hole transport layer 42 adjacent to the first light-emitting sub-layer 61.

Alternatively, based on the configuration as shown in FIG. 3, the hole injection layer 3 may not be comprised in the organic functional layer of the organic light-emitting device of the present embodiment.

Alternatively, based on the configuration as shown in FIG. 3, the electron blocking layer 5 may not be comprised in the organic functional layer of the organic light-emitting device of the present embodiment. Of course, in actual application, the electron blocking layer 5 may be disposed, and moreover, the range of material selection for the electron blocking layer 5 may be identical to the range of material selection for the hole transport layer 4 in Embodiment 1.

Alternatively, the aforementioned organic functional layer may only comprise the hole transport layer 4, the light-emitting layer 6 and the electron transport layer 8, and the hole transport layer comprises the first hole transport layer 41 and the second hole transport layer 42.

The material for preparing the first hole transport layer 41 is identical to the material for preparing the hole transport layer 4 in Embodiment 1. In the meanwhile, the position of HOMO (Highest Occupied Molecular Orbital) of the second hole transport layer 42 matches the position of HOMO of the first light-emitting sub-layer 61 well. Preferably, the positions of the energy levels of them are different from each other by no more than 0.2 ev. That is, the position of HOMO of the second hole transport layer 42 is different from the HOMO of the matrix material for the first light-emitting sub-layer 61 by no more than 0.2 ev; and the positions of LUMO (Lowest Unoccupied Molecular Orbital) of the second hole transport layer 42 and the matrix material with hole transport capacity for the first light-emitting sub-layer 61 are higher than the position of LUMO of the matrix material with electron transport capacity for the second light-emitting sub-layer 62. That is, the position of HOMO of the second hole transport layer 42 is higher than the position of HOMO of the matrix material for the first light-emitting sub-layer 61 by 0.2 ev or less.

Preferably, the material for preparing the second hole transport layer 42 is the same as the material for preparing the matrix material for the first light-emitting sub-layer 61, that is, a material with hole transport capacity is employed.

Moreover, in the present embodiment, the position of LUMO of the electron transport layer 8, which is adjacent to the light-emitting layer, is lower than the position of LUMO of the matrix material for the third light-emitting sub-layer 63 by 0.2 ev or less. Preferably, the same material as the matrix material for the third light-emitting sub-layer 63 is employed for the hole and exciton blocking layer 7 adjacent to third light-emitting sub-layer 63 and the electron transport layer 8, that is, a material with electron transport capacity is employed.

Furthermore, the hole transport layer 4 in the embodiment of the present invention may comprise two or more hole transport sub-layers, which at least comprises a first hole transport layer 41', adjacent to the hole injection layer, and a second hole transport layer 42' (not shown in the figures), adjacent to the first light-emitting sub-layer. The position of HOMO of the second hole transport layer 42' is higher than the position of HOMO of the matrix material for the first light-emitting sub-layer 61 by 0.2 ev or less. Preferably, the second hole transport layer 42' is prepared from the same material as the matrix material for the first light-emitting sub-layer 61. Moreover, the position of LUMO of the electron transport layer is lower than the position of LUMO of the matrix material for the third light-emitting sub-layer by 0.2 ev or lower. Preferably, the electron transport layer is made from the same material as the matrix material for the third light-emitting sub-layer.

In the present embodiment, other layers of the organic light-emitting device have the same structures as those in Embodiment 1, which is not repeated here.

In the present embodiment, the specific examples of the various layers in the organic light-emitting device are as follows with preparative materials/thickness of the specific layers: Glass/ITO/2-TNATA (10 nm)/NPB (20 nm)/TCTA (10 nm)/TCTA: Ir(ppy)3 (10 nm)/TCTA: TPBI: Ir(ppy)3 (10 nm)/TPBI: Ir(ppy)3 (10 nm)/TPBI (40 nm)/LiF (0.5 nm)/Al (200 nm). That is, the substrate 1 is made from glass; the anode layer 2 is made from ITO; the hole injection layer 3 is made from 2-TNATA with a thickness of 10 nm; the first hole transport layer 41 is made from NPB with a thickness of 20 nm; the second hole transport layer 42 is made from TCTA with a thickness of 10 nm; the first light-emitting sub-layer 61 is made from TCTA: Ir(ppy)3 with a thickness of 10 nm; the second light-emitting sub-layer 62 is made from TCTA: TPBI: Ir(ppy)3 with a thickness of 10 nm; the third light-emitting sub-layer 63 is made from TPBI: Ir(ppy)3 with a thickness of 10 nm; the hole and exciton blocking layer 7, which also acts as the electron transport layer 8, is made from TPBI with a thickness of 40 nm; the electron injection layer 9 is made from LiF with a thickness of 0.5 nm; and the cathode layer 10 is made from Al with a thickness of 200 nm. Among them, a green phosphorescent dopant Ir(ppy)3 is employed for the light-emitting material (i.e., dopant) for all three light-emitting sub-layers in the recombination light-emitting layer.

The method of preparing the organic light-emitting device in the present embodiment comprises the following steps:

S1) Cleaning the Substrate

The substrate 1 is subjected to ultrasonic cleaning in sequence in a cleaning agent, acetone solution and deionized water, and then dried with dry nitrogen gas.

S2) Preparing the Anode or Cathode Layer

The substrate 1 is transferred into a vacuum evaporating chamber, which has a degree of vacuum set at $2 \times 10^{-4}$ Pa. An indium tin oxide (ITO) film is formed on the substrate 1, thereby forming the anode layer 2 of the organic light-emitting device on the substrate 1. Moreover, the ITO film has square resistance of 25 Ω/□.

S3) Pre-Treating the Formed Anode Layer or Cathode Layer

In the present embodiment, the substrate 1 having the formed anode layer 2 is subjected to an ultraviolet light treatment for 25 minutes so as to improve the cleanliness and surface smoothness of the ITO film, improve the surface property of the ITO film and increase its work function value.

S4) Preparing the Organic Functional Layers

The treated substrate 1 is placed in a vacuum chamber. After the degree of vacuum in the vacuum chamber is sucked to $2 \times 10^{-4}$ Pa, evaporation deposition is conducted to form the organic functional layer.

Specifically, in the present embodiment, the order of evaporation deposition is as follows: the hole injection layer 3, made from 2-TNATA with a thickness of 10 mm and an evaporation deposition rate of 0.08 mm/s; the first hole transport layer 41, made from NPB with a thickness of 20 nm and an evaporation deposition rate of 0.08 mm/s; the second hole transport layer 42, made from TCTA with a thickness of 10 nm and an evaporation deposition rate of 0.08 mm/s; in the light-emitting layer 6, the first light-emitting sub-layer 61, made from TCTA, employed as the matrix material and doped with a light-emitting material Ir(ppy)3, with a thickness of 10 nm and an evaporation deposition rate of 0.08 mm/s; the second light-emitting sub-layer 62, made from, the mixture of TCTA and TPBI, employed as the mixture matrix material and doped with a light-emitting material Ir(ppy)3, with a thickness of 10 nm and an evaporation deposition rate of 0.08 mm/s; the third light-emitting sub-layer 63, made from TPBI, employed as the matrix material and doped with a light-emitting material Ir(ppy)3, with a thickness of 10 nm and an evaporation deposition rate of 0.08 mm/s; the hole and exciton blocking layer 7, also serving as the electron transport layer 8, made from TPBI with a thickness of 40 nm and an evaporation deposition rate of 0.08 mm/s; and the electron injection layer 9, made from LiF with a thickness of 0.5 nm and an evaporation deposition rate of 0.02 mm/s.

S5) Preparing the Anode Layer or the Cathode Layer

The cathode layer 10 is formed by evaporation deposition under a high vacuum condition having a degree of vacuum of $5 \times 10^{-4}$.

The cathode layer 10 is made from metal Al with a thickness of 200 nm and an evaporation deposition rate of 1.5 nm/s.

The evaporation deposition rate and the thickness of the various layers in the organic function layer in the organic light-emitting device, which are involved in the aforementioned step S2~S5, are monitored by a film thickness meter disposed close to the substrate.

S6) Encapsulating

The prepared organic light-emitting device is transferred to a manual operating box for encapsulating. The manual operating box is in an inert atmosphere, and in the present embodiment, nitrogen atmosphere.

S7) Testing

The prepared organic light-emitting device is tested for its photoelectric performance.

Figure 4:
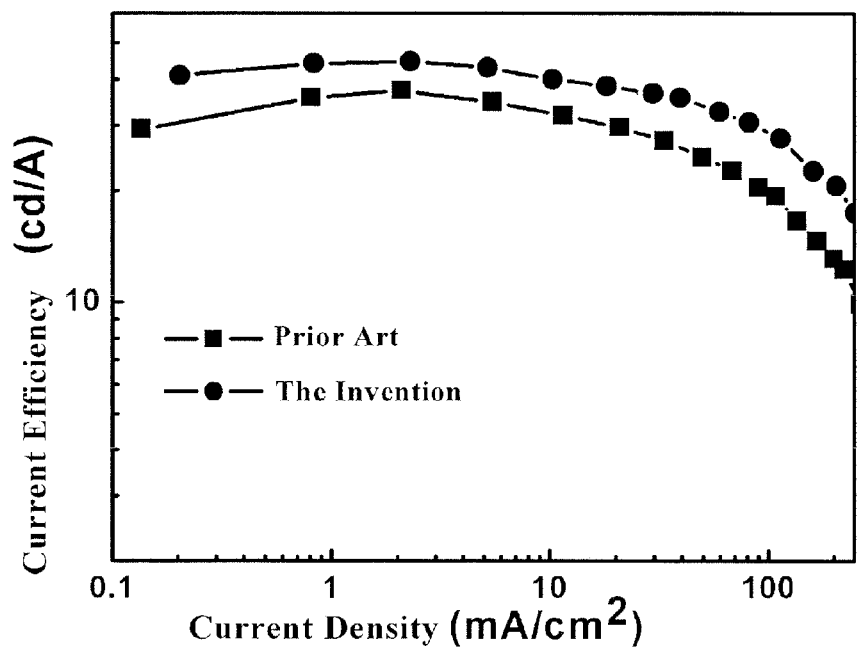
FIG. 4 is a diagram of current density vs. current efficiency of the organic light-emitting device as shown in Embodiment 2.

FIG. 4 shows the diagram of current density vs. current efficiency of the organic light-emitting device in the present embodiment. Compared to the organic light-emitting device in prior art (for example, with the specific configuration of Glass/ITO/2-TNATA (10 nm)/NPB (20 nm)/TCTA (10 nm)/ TCTA: Ir(ppy)3 (15 nm)/TPBI: Ir(ppy)3 (15 nm)/TPBI (40 nm)/LiF (0.5 nm)/Al (200 nm)), the organic light-emitting device in the present embodiment employs three light-emitting sub-layers, resulting in a wide recombination region in the light-emitting layer, which can effectively suppress the quenching of the excitons and improve the light-emitting efficiency of the organic light-emitting device. From FIG. 4, it can be seen that the current efficiency of the organic light-emitting device is apparently higher than the current efficiency of the organic light-emitting device in prior art.

Figure 6:
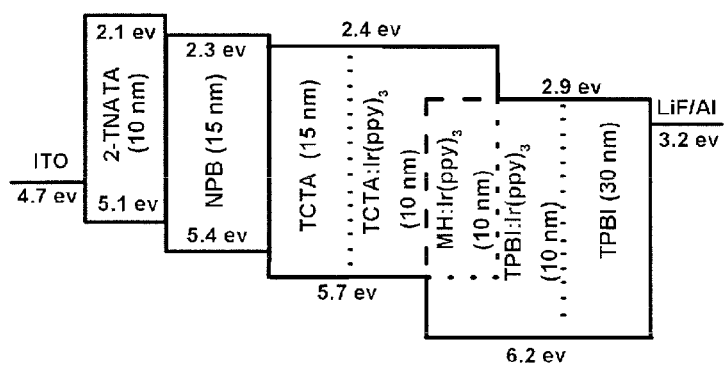
FIG. 6 is a schematic diagram of the energy level structure of Embodiment 2.

FIG. 6 is a schematic diagram of the energy level structure of the organic light-emitting device of the present embodiment. As shown in FIG. 6, in the present embodiment, there is an apparent carrier potential barrier at the interface between the first light-emitting sub-layer 61 and the second light-emitting sub-layer 62, also at the interface between the second light-emitting sub-layer 62 and the third light-emitting sub-layer 63, so a portion of carriers are blocked at the two interfaces to form carrier recombination regions. Since the diffusion length of excitons is generally less than 10 nm, excitons usually will not diffuse to regions where no dopants (light-emitting materials) are doped, that is, the primary recombination region of excitons essentially lies within the light-emitting layer, and thus the amount of excitons undergoing non-radiative transition is reduced, and the effect of the non-radiative decay on the life span of the organic light-emitting device can be avoided, and meanwhile an improvement of the light-emitting efficiency of the organic light-emitting device is obtained. Moreover, since the transport of both kinds of carriers is possible in the second light-emitting sub-layer 62, the carrier recombination region in the second light-emitting sub-layer 62 is wider than the interface between the first light-emitting sub-layer 61 and the second light-emitting sub-layer 62, and also wider than the interface between the second light-emitting sub-layer 62 and the third light-emitting sub-layer 63.

The organic light-emitting device of the present embodiment, by dividing the light-emitting layer into three light-emitting sub-layers by employing matrix materials with different carrier transport capacity, makes the recombination region in the light-emitting layer wider, as well as makes the energy level of the hole transport layer 4 match the energy level of the first light-emitting sub-layer 61, and the energy level of the electron transport layer 8 match the energy level of the third light-emitting sub-layer 63, and more preferably further incorporate the second hole transport layer 42, which is made from the same material as the matrix material with hole transport capacity in the first light-emitting sub-layer 61, which configuration reduces the injection potential barrier for holes between the hole transport layer 4 and the light-emitting layer 6 so as to ensure the effect injection of holes into the light-emitting layer. In the meanwhile, the hole and exciton blocking layer and the electron transport layer are both produced by employing the same material as the matrix material for the third light-emitting sub-layer 63 so as to ensure the effective injection of electrons into the light-emitting layer 6, greatly improving the light-emitting efficiency of the organic light-emitting device.

Embodiment 3

The organic light-emitting device in the present embodiment has the same configuration as the light-emitting device in Embodiment 2, except that it differs from Embodiment 2 in that the light-emitting material(s) employed in the light-emitting layer is different. In the present embodiment, the light-emitting material employed in the light-emitting layer is the phosphorescent dopant, IrPi, which has a short triplet life (less than 500 ns), and the contents of the dopant in the three light-emitting sub-layers are all 6%.

For example, the component materials of the organic light-emitting device in the present embodiment are as follows: Glass/ITO/2-TNATA (10 nm)/NPB (20 nm)/TCTA (10 nm)/ TCTA: IrPi(10 nm)/TCTA: TPBI: IrPi (10 nm)/TPBI: IrPi(10 nm)/TPBI (40 nm)/LiF (0.5 nm)/Al (200 nm). That is, the three light-emitting sub-layers in the light-emitting layer of the present embodiment are as follows: the first light-emitting sub-layer 61: made from TCTA:IrPi with a thickness of 10 nm; the second light-emitting sub-layer 62: made from TCTA:TPBI:IrPi with a thickness of 10 nm: and the third light-emitting sub-layer 613 made from TPBI:IrPi with a thickness of 10 nm. Within all of them, IrPi (a green phosphorescent dopant) is employed as the light-emitting material (dopant).

Figure 5:
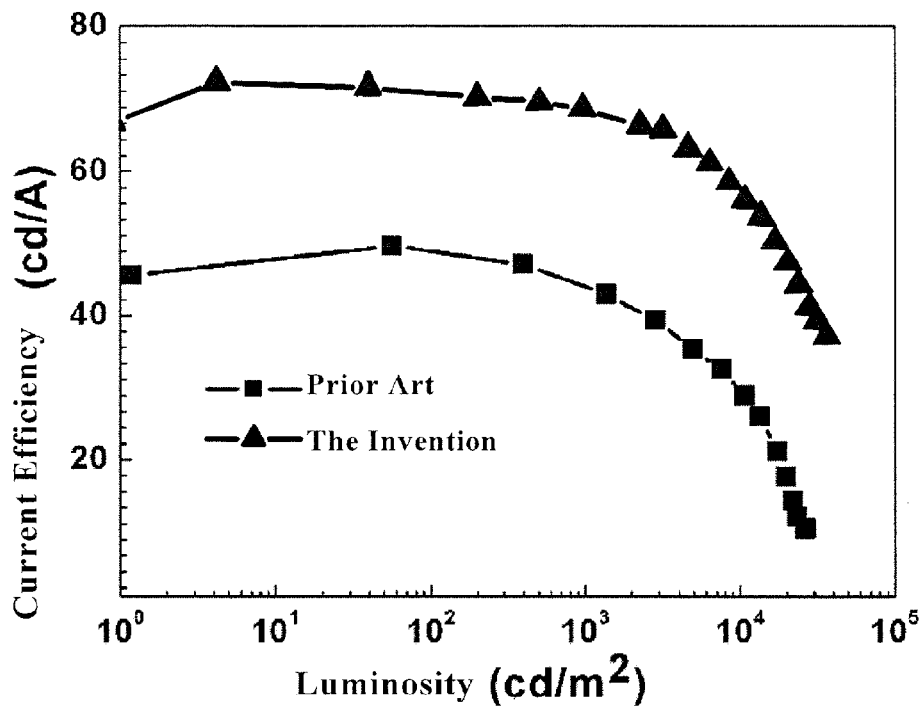
FIG. 5 is a diagram of luminosity vs. current efficiency of the organic light-emitting device as shown in Embodiment 3.

FIG. 5 shows the diagram of luminosity vs. current efficiency in the organic light-emitting device of the present embodiment. From the figure it can be seen that the current efficiency of the organic light-emitting device in the present embodiment is much higher than the current efficiency of the organic light-emitting device in prior art.

FIG. 7 is a schematic diagram of the energy level structure of the organic light-emitting device of the present embodiment. From the figure, it can be seen that this organic light-emitting device has a wide recombination region which reduces the concentration of the accumulated carriers and excitons, suppresses the quenching of excitons and increases the recombination probability of the hole carriers and the electron carriers.

In the present embodiment, other layers of the organic light-emitting device have the same structure as in Embodiment 2, which is not repeated here.

It should be understood that the structure of the organic light-emitting device in Embodiments 1-3 in which a plurality of light-emitting sub-layers are formed by providing matrix materials with different carrier transport capacity in the light-emitting layer is not only applicable for the bottom emitting organic light-emitting devices as described in Embodiments 1-3, but also applicable to top emitting organic light-emitting devices.

In the present invention, the light-emitting layer in the organic light-emitting device is provided as a composite light-emitting layer comprising a plurality of light-emitting sub-layers, so that hole carriers and electron carriers are distributed in a wide range, which increases the width of the carrier recombination region, reduces the concentration of accumulated carriers and excitons in any given region, makes excitons distribute in a wide range with a balanced density, reduces the accumulation of excitons and suppresses the quenching of excitons. In the meanwhile, since materials matching the carrier transport layers are employed as the matrix materials in the light-emitting sub-layers in the light-emitting layer in contact with the corresponding carrier transport layers, the injection potential barrier of the carriers are lowered, the efficiency of the injection of electron carriers and hole carriers into the light-emitting layer is increased, the recombination probability of the electron carriers and the hole carriers is increased, the carrier utilization ratio is improved, and finally the light-emitting efficiency of the organic light-emitting device is improved, which ensures that the organic light-emitting device still has high current efficiency under high luminosity and the performance of the organic light-emitting device is improved.

The aforementioned are merely exemplary embodiments of the invention, rather than limiting the scope of the invention which is determined by the appended claims.

The invention claimed is:

1. An organic light-emitting device comprising a substrate, an anode layer, a cathode layer and an organic functional layer disposed between the anode layer and the cathode layer, wherein the organic functional layer comprises a light-emitting layer, and the light-emitting layer comprises three successive light-emitting sub-layers, including, a first light-emitting sub-layer close to the anode layer, a second light-emitting sub-layer, and a third light-emitting sub-layer close to the cathode layer;
wherein each of the three light-emitting sub-layers comprises a matrix material doped with a light-emitting material and the three light-emitting sub-layers are all doped with the light-emitting material emitting light of a same color; and
wherein a mixture matrix material is employed as the matrix material for the second light-emitting sub-layer, and the mixture matrix material comprises a matrix material with hole transport capacity and a matrix material with electron transport capacity that are mixed together; a matrix material with hole transport capacity is employed as the matrix material for the first light-emitting sub-layer; and a matrix material with electron transport capacity is employed as the matrix material for the third light-emitting sub-layer.

2. The organic light-emitting device according to claim 1, wherein an energy level of HOMO of the matrix material for the first light-emitting sub-layer is 0.2ev or more higher than an energy level of HOMO of the matrix material for the third light-emitting sub-layer, and an energy level of LUMO of the matrix material for the first light-emitting sub-layer is 0.2ev or more higher than an energy level of LUMO of the matrix material for the third light-emitting sub-layer.

3. The organic light-emitting device according to claim 1, wherein in the mixture matrix material for the second light-emitting sub-layer, the matrix material with hole transport capacity comprises a matrix material identical to the matrix material for the first light-emitting sub-layer, and the matrix material with electron transport capacity comprises a matrix material identical to the matrix material for the third light-emitting sub-layer.

4. The organic light-emitting device according to claim 3, wherein in the mixture matrix material for the second light-emitting sub-layer, a mixing ratio of the matrix material with hole transport capacity to the matrix material with electron transport capacity is in the range of 1:9~9:1.

5. The organic light-emitting device according to claim 1, wherein aromatic diamine compounds, triphenylamine compounds, aromatic triamine compounds, benzidine derivatives or triarylamine polymers are employed as the matrix material for the first light-emitting sub-layer and the matrix material with hole transport capacity in the second light-emitting sub-layer; metal complexes, carbazole derivatives, imidazole derivatives, phenanthroline derivatives or anthracene derivatives are employed as the matrix material for the third light-emitting sub-layer and the matrix material with electron transport capacity in the second light-emitting sub-layer; and a phosphorescent material based on Ir, Pt, Ru or Cu is employed as the light-emitting material in the first, second and third light-emitting sub-layers.

6. The organic light-emitting device according to claim 5, wherein 9,10-bis(2-naphthyl)anthracene, TAZ, CBP, MCP, TCTA or NPB is employed as the matrix material for the first light-emitting sub-layer and the matrix material with hole transport capacity in the second light-emitting sub-layer; and 8-hydroxyquinoline aluminum, 8-hydroxyquinoline lithium, 1,3,5-tris(N-phenyl-2-benzimidazole-2)benzene, BCP or Bphen is employed as the matrix material for the third light-emitting sub-layer and the matrix material with electron transport capacity in the second light-emitting sub-layer.

7. The organic light-emitting device according to claim 1, wherein a thickness of the light-emitting layer is in the range of 3-300 nm, and a thickness of each of the first, second and third light-emitting sub-layers is in the range of 1~100 nm.

8. The organic light-emitting device according to claim 1, wherein the organic functional layer further comprises a hole transport layer and an electron transport layer, the hole transport layer is adjacent to the first light-emitting sub-layer and on a side close to the anode, and the electron transport layer is adjacent to the third light-emitting sub-layer and on a side close to the cathode, and wherein the energy level of the hole transport layer matches the energy level of the matrix material for the first light-emitting sub-layer, and the energy level of the electron transport layer matches the energy level of the matrix material for the third light-emitting sub-layer.

9. The organic light-emitting device according to claim 8, wherein an energy level of HOMO of the hole transport layer is higher than an energy level of HOMO of the matrix material for the first light-emitting sub-layer by 0.5ev or less, and an energy level of LUMO of the electron transport layer is lower than an energy level of LUMO of the matrix material for the third light-emitting sub-layer by 0.5ev or less.

10. The organic light-emitting device according to claim 8, wherein the hole transport layer comprises two or more hole transport sub-layer, which at least comprises a first hole transport layer and a second hole transport layer, the second hole transport layer is adjacent to the first light-emitting sub-layer, and wherein the energy level of HOMO of the second hole transport layer is higher than the energy level of HOMO of the matrix material for the first light-emitting sub-layer by no more than 0.2ev.

11. A display device comprising the light-emitting device according to claim 1.

12. The organic light-emitting device according to claim 1, wherein the organic functional layer further comprises a hole transport layer and an electron transport layer, the hole transport layer is adjacent to the first light-emitting sub-layer and on a side close to the anode, and the electron transport layer is adjacent to the third light-emitting sub-layer and on a side close to the cathode, and wherein the energy level of the hole transport layer matches the energy level of the matrix material for the first light-emitting sub-layer, and the energy level of the electron transport layer matches the energy level of the matrix material for the third light-emitting sub-layer.

13. The organic light-emitting device according to claim 12, wherein an energy level of HOMO of the hole transport layer is higher than an energy level of HOMO of the matrix material for the first light-emitting sub-layer by 0.5ev or less, and an energy level of LUMO of the electron transport layer is lower than an energy level of LUMO of the matrix material for the third light-emitting sub-layer by 0.5ev or less.

14. The organic light-emitting device according to claim 12, wherein the hole transport layer comprises two or more hole transport sub-layer, which at least comprises a first hole transport layer and a second hole transport layer, the second hole transport layer is adjacent to the first light-emitting sub-layer, and wherein the energy level of HOMO of the second hole transport layer is higher than the energy level of HOMO of the matrix material for the first light-emitting sub-layer by no more than 0.2ev.

* * * * *